(12) United States Patent
Hosoi

(10) Patent No.: US 7,884,699 B2
(45) Date of Patent: Feb. 8, 2011

(54) VARIABLE RESISTOR ELEMENT, MANUFACTURING METHOD THEREOF, AND MEMORY DEVICE PROVIDED WITH IT

(75) Inventor: Yasunari Hosoi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 458 days.

(21) Appl. No.: 11/997,184

(22) PCT Filed: Jul. 21, 2006

(86) PCT No.: PCT/JP2006/314487

§ 371 (c)(1),
(2), (4) Date: Jan. 29, 2008

(87) PCT Pub. No.: WO2007/018026

PCT Pub. Date: Feb. 15, 2007

(65) Prior Publication Data

US 2010/0085142 A1    Apr. 8, 2010

(30) Foreign Application Priority Data

Aug. 5, 2005   (JP)   ............................. 2005-228600

(51) Int. Cl.
*H01C 7/10*   (2006.01)
(52) U.S. Cl. ....................... 338/22 R; 365/148; 257/295
(58) Field of Classification Search ............... 338/22 R; 257/295, 296, 306, 310; 365/163, 148, 100, 365/48
See application file for complete search history.

(56) References Cited

U.S. PATENT DOCUMENTS 6,204,139 B1   3/2001   Liu et al.
6,815,744 B1   11/2004   Beck et al.
2004/0245557 A1*   12/2004   Seo et al. ..................... 257/298
2005/0002227 A1*   1/2005   Hideki et al. ............... 365/163
2005/0117397 A1*   6/2005   Morimoto .............. 365/185.21

FOREIGN PATENT DOCUMENTS

JP   2002-537627   11/2002

OTHER PUBLICATIONS

International Search Report of PCT/JP2006/314487 mailed Oct. 3, 2006.

(Continued)

*Primary Examiner*—Kyung Lee
(74) *Attorney, Agent, or Firm*—Nixon & Vanderhye P.C.

(57) ABSTRACT

A variable resistor element comprising a first electrode, a second electrode, and a variable resistor positioned between the first and second electrodes, and changing in electric resistance when a voltage pulse is applied between the both electrodes, has posed problems that it has a restriction of having to use noble metal electrodes as an electrode material and is not compatible with a conventional CMOS process. A variable resistor element using an oxynitride of transition metal element as a variable resistor exhibits a stable switching operation, is satisfactory in data retaining characteristics, and requires a small programming current. Since it does not necessarily require noble metal as an electrode material, it is high in compatibility with the existing CMOS process and easy to produce. It can be formed by a simple step of forming a variable resistor material into a film by oxidizing a lower electrode surface consisting of conductive nitride.

14 Claims, 16 Drawing Sheets

OTHER PUBLICATIONS

Liu et al.: "Electric-pulse-induced reversible resistance change effect in magnetoresistive films," Applied Physics Letters, vol. 76, No. 19, pp. 2749-2751, May 2000.

Baek, I.G. et al.: "Highly Scalable Non-volatile Resistive Memory using Simple Binary Oxide Driven by Asymmetric Unipolar Voltage Pulses," IEEE Technical Digest of 2004 International Electron Devices Meeting, pp. 587-590, Dec. 2004.

H. Pagnia et al.: "Bistable Switching in Electroformed Metal-Insulator-Metal Devices," phys, stat, sol. (a) 108, pp. 11-65, (1988).

International Search Report for PCT/JP2006/324802 mailed Mar. 13, 2007.

Fujimoto et al., High Speed Resistive Switching of $TiO_2$/TiN Nano-Crystalline Thin Film, *Japanese Journal of Applied Physics*, vol. 45, No. 11, Mar. 2006, pp. L310-L312.

Kinoshita et al., New Model Proposed for Switching Mechanism of ReRAM, *Proc. IEEE Non-Volatile Semiconductor Memory Workshop*, Dec. 2006, pp. 84-85.

Kinoshita et al., "Bias polarity dependent data retention of resistive random access memory consisting of binary transition metal oxide", *Applied Physics Letter*, vol. 89, Jun. 2006, 103509.

Taylor et al, "RF Relaxation Oscillations in Polycrystalline TiO2 Thin Films", Solid-State Electronics, vol. 19, 1976, pp. 669-674.

Argall et al, "Switching Phenomena in Titanium Oxide Thin Films", Solid-State Electronics, Perfgamon Press 1968, vol. 11, pp. 535-541.

Beam et al, "Further Properties and a Suggested Model for Niobium Oxide Negative Resistance", Proceedings of the IEEE, 52, pp. 300-301, 1964.

Seo et al, "Conductivity Switching Characteristics and Reset Currents in NiO Films", Applied Physics Letters 86, 093509 (2005).

Office Action mailed Dec. 23, 2009 in co-pending U.S. Appl. No. 12/092,766 (11 pages).

* cited by examiner

VARIABLE RESISTOR ELEMENT, MANUFACTURING METHOD THEREOF, AND MEMORY DEVICE PROVIDED WITH IT

CROSS-REFERENCE TO RELATED APPLICATIONS

This application is a National Phase filing under 35 U.S.C. §371 of International Application No. PCT/JP2006/314487 filed on Jul. 21, 2006, and which claims priority to Japanese Patent Application No. 2005-228600 filed on Aug. 5, 2005.

TECHNICAL FIELD

The present invention relates to a variable resistor element comprising a first electrode, a second electrode, and a variable resistor sandwiched between the first electrode and the second electrode and having an electric resistance changed when a voltage pulse is applied between both electrodes, and its manufacturing method. In addition, the present invention relates to a memory device comprising the variable resistor element.

BACKGROUND ART

Recently, as a next-generation NVRAM (Nonvolatile Random Access Memory) capable of operating at high speed to replace a flash memory, various kinds of device structures such as a FeRAM (Ferroelectric RAM), a MRAM (Magnetic RAM), an OUM (Ovonic Unified Memory) are proposed and a fierce development race is carried on to implement high performance, high reliability, low cost, and process compatibility. However, each above memory device has good and bad points and it is far from an ideal "universal memory" having all good points of a SRAM, a DRAM and a flash memory.

Based on the existing technique, a RRAM (Resistive Random Access Memory) comprising a variable resistor element in which an electric resistance is reversibly changed when a voltage pulse is applied has been proposed. The variable resistor element has an extremely simple structure in which a lower electrode 3 serving as a second electrode, a variable resistor 2 and an upper electrode 1 serving as a first electrode are sequentially laminated as shown in FIG. 1, and a resistance value can be reversibly changed when a voltage pulse is applied between the upper electrode 1 and the lower electrode 3. A new nonvolatile memory device can be implemented by reading a resistance value in the reversible resistance changing operation (referred to as the "switching operation" occasionally hereinafter).

As a material of the variable resistor 2, a method of changing an electric resistance reversibly by applying a voltage pulse to a perovskite material known for its colossal magnetoresistance effect is disclosed in the following patent document 1 and non-patent document 1 by Shangquing Liu and Alex Ignatiev et at in U.S. Houston University. This is an extremely epoch-making method in which while the perovskite material known for its colossal magnetoresistance effect is used, a resistance change over several digits can be provided at room temperature without applying a magnetic field. In addition, according to an element structure disclosed in the patent document 1, a crystalline praseodymium calcium manganese oxide $Pr_{1-x}Ca_xMnO_3$ (PCMO) film that is a perovskite-type oxide is used as a material of the variable resistor 2.

In addition, it is reported that when an oxide of transition metal element such as titanium oxide ($TiO_2$) film, a nickel oxide (NiO) film, a zinc oxide (ZnO) film, or a niobium oxide ($Nb_2O_5$) film is used as the material of the variable resistor 2, it shows a reversible resistance change according to a non-patent document 2 and a patent document 2. A phenomenon of the switching operation using NiO is described in detail in a non-patent document 3.

Patent document 1 U.S. Pat. No. 6,204,139

Non-patent document 1: Liu, S. Q. et al., "Electric-pulse-induced reversible Resistance change effect in magnetoresistive films", Applied Physics Letter, Vol. 76, pp. 2749-2751, 2000

Non-patent document 2: H. Pagnia et al., "Bistable Switching in Electroformed Metal-Insulator-Metal Devices", Phys. Stat. Sol. (a), vol. 108, pp. 11-65, 1988

Patent Document 2: Japanese National Publication of PCT Application No. 2002-537627

Non-patent document 3: Baek, I. G. et al., "Highly Scalable Non-volatile Resistive Memory using Simple Binary Oxide Driven by Asymmetric Unipolar Voltage Pulses", IEDM 04, pp. 587-590, 2004

DISCLOSURE OF THE INVENTION

Problems to Be Solved by the Invention

However, when a perovskite-type oxide is used as the material of the variable resistor 2 changing its resistance by the voltage pulse, the resistance change is small and the stable switching operation is not provided depending on the material, or it is necessary to use a noble metal electrode having good lattice compatibility with the perovskite-type oxide and high conductivity and high resistance to oxidation as the lower electrode 3, which is bad in compatibility with a conventional CMOS process.

In addition, when the oxide of the transition metal element is used as the material of the variable resistor 2, the problem is that a programming current is large (several mA) according to the non-patent document 3 using NiO, for example. In addition, there is a restriction in the material of the upper electrode 1 or the lower electrode 3 such that a noble metal electrode is preferable in view of reliability.

An aspect of the present invention was made as one means for solving the above problems and it is an object of one or more aspects of the present invention to provide a variable resistor element implementing a stable switching operation and having preferable retaining characteristics by an easy method that is high in compatibility with a CMOS process.

Means for Solving the Problem

A variable resistor element according to an aspect of the present invention in order to attain the above object comprises a first electrode, a second electrode, and a variable resistor positioned between the first electrode and the second electrode, and changes in electric resistance between the first electrode and the second electrode when a voltage pulse is applied between the first electrode and the second electrode, and it is characterized in that the variable resistor is an oxynitride of a transition metal element.

In addition, the variable resistor element according to an aspect of the present invention is characterized in that the variable resistor is an oxynitride of an element selected from titanium, nickel, vanadium, zirconium, tungsten, cobalt, and zinc.

In addition, the variable resistor element according to an aspect of the present invention is characterized in that the second electrode is a conductive nitride containing the same element as the transition metal constituting the variable resistor which is an oxynitride.

In addition, the variable resistor element according to an aspect of the present invention is characterized in that the second electrode is a conductive nitride of an element selected from titanium, nickel, vanadium, zirconium, tungsten, cobalt, and zinc.

Furthermore, the variable resistor element according to an aspect of the present invention is characterized in that the smaller one of an area of a region in which the first electrode and the variable resistor contact or face each other and an area of a region in which the second electrode and the variable resistor contact or face each other is not more than 0.06 $\mu m^2$.

A manufacturing method of the variable resistor element according to an aspect of the present invention is characterized by comprising a step of forming the second electrode comprising a conductive nitride of a transition metal, a step of forming the variable resistor comprising an oxynitride of a transition metal element by oxidizing the surface of the second electrode, and a step of forming the first electrode.

The manufacturing method of the variable resistor element according to an aspect of the present invention is characterized in that the second electrode is a conductive nitride of an element selected from titanium, nickel, vanadium, zirconium, tungsten, cobalt, and zinc.

A memory device according to an aspect of the present invention is provided with a variable resistor element comprising a first electrode, a second electrode, and a variable resistor positioned between the first electrode and the second electrode, and changing in electric resistance between the first electrode and the second electrode when a voltage pulse is applied between the first electrode and the second electrode, and it is characterized in that the variable resistor is an oxynitride of a transition metal element.

Effect Of The Invention

According to the variable resistor element comprising the variable resistor formed of the oxynitride of the transition metal element in one or more aspects of the present invention, a stable switching operation is provided and data retaining characteristics are preferable.

When the variable resistor element according to one or more aspects of the present invention is used, since noble metal is not always needed as the electrode material, the variable resistor element has high compatibility with an existing CMOS process and easily manufactured.

In addition, according to the variable resistor element of one or more aspects of the present invention, the variable resistor material can be formed by oxidizing the lower electrode surface comprising the conductive nitride. According to an aspect of the inventive manufacturing method, since the variable resistor film can be formed in a heat treatment process for oxidation that is a general process in a semiconductor process, a special device to form the film is not needed.

Furthermore, according to the memory device comprising the variable resistor element of one or more aspects of the present invention, since the memory device having preferable data retaining characteristics can be implemented by the stable switching operation having a large resistance ratio, it can be applied to a recording medium of an electronic device such as a memory card, a mobile telephone, a mobile game, a digital camera, and a printer.

Figure 1:
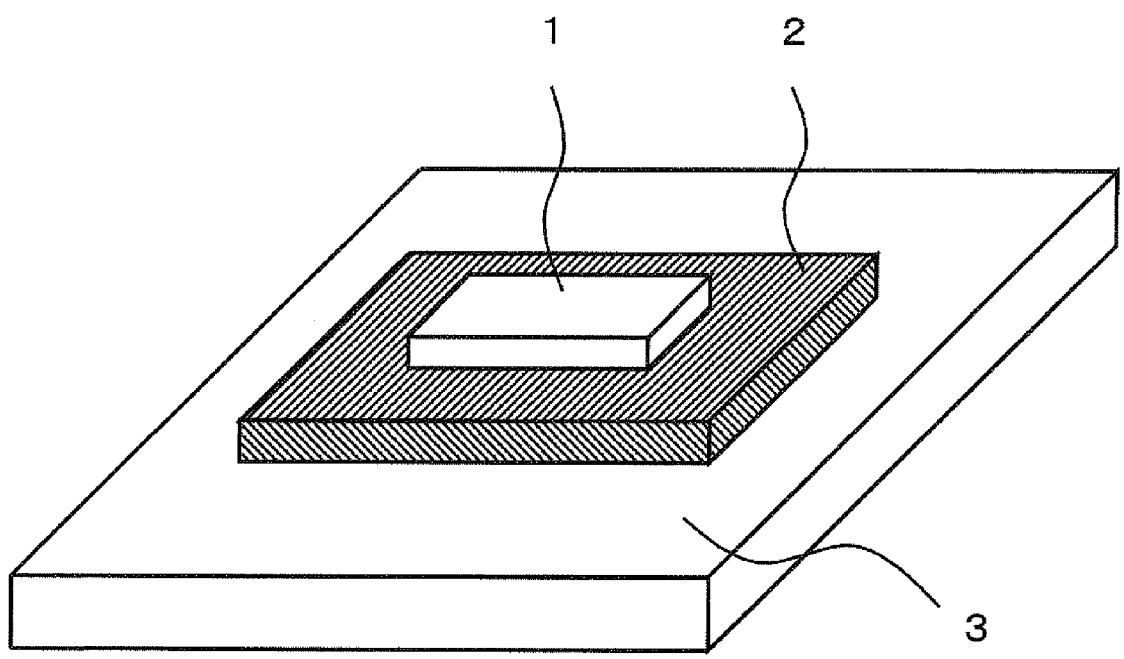
FIG. 1 is a perspective view showing a basic structure of a variable resistor element.

EXPLANATION OF REFERENCES 1, 11 First electrode
2, 12 Variable resistor
3, 13 First electrode
14 Interlayer insulation film
15 Contact hole
16 Metal wiring
21 Variable resistor element
22 Pulse generator
23 Digital Oscilloscope
24 Parameter analyzer
25 Switch 30 Memory device according to the present invention
31 Memory cell array
32 Control circuit
33 Reading circuit
34 Bit line decoder
35 Word line decoder
36 Voltage pulse generation circuit
W1, W2, ..., Wn, Wx, Wy Word line
B1, B2, ..., Bm, Bx, By Bit line
S Source line
R Variable resistor element
T Selection transistor
101 Semiconductor substrate
102 Element isolation region
103 Gate insulation film
104 Gate electrode
105 Drain diffusion layer region
106 Source diffusion layer region
107 First interlayer insulation film
108, 114, 115 Contact hole
109 Bather layer
110 Lower electrode
111 Variable resistor
112 Upper electrode
113 Second interlayer insulation film
116, 117 First wiring
118 Third interlayer insulation film
119 Second wiring
120 Surface protection film

DETAILED DESCRIPTION OF THE INVENTION

Embodiments of a variable resistor element according to one or more aspects of the present invention will be described with reference to the drawings hereinafter. In addition, the inventors of the present invention has found that an oxynitride of a transition metal element shows a switching phenomenon in which a resistance is changed by application of a voltage pulse and can be used as a variable resistor material, which leads to the disclosed subject matter.

EXAMPLE 1

According to a variable resistor element in a first embodiment of the present invention, a variable resistor 2 comprising an oxynitride of a transition metal element is formed of a TiON (titanium oxynitride) film. A specific example of the first embodiment will be described as an example 1 hereinafter.

Figure 7:
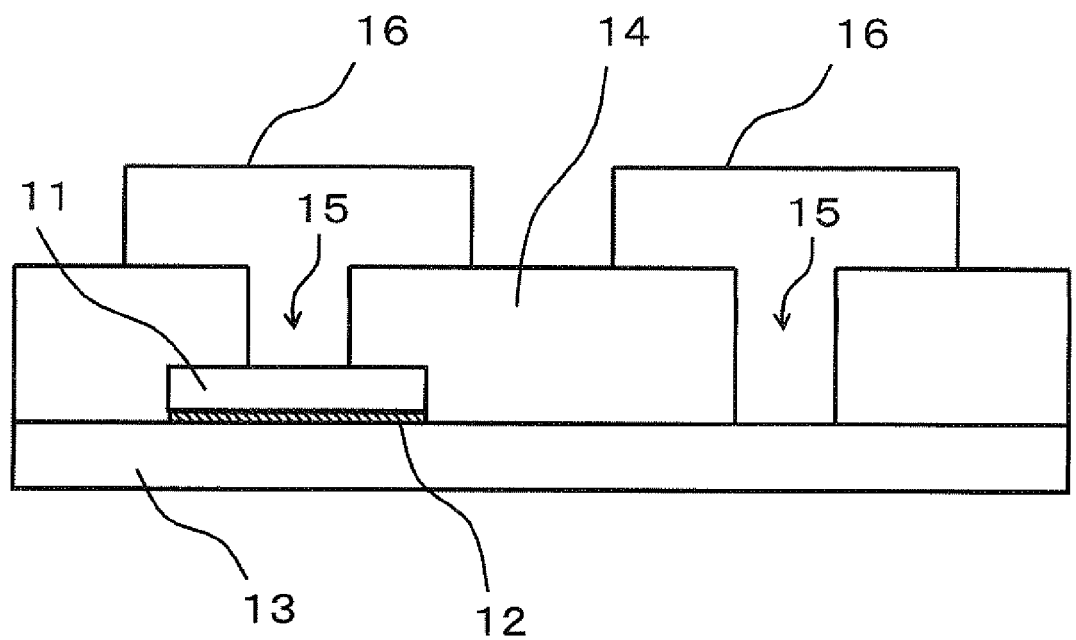
FIG. 7 is a schematic sectional view showing the variable resistor element according to the embodiment of the present invention in the order of manufacturing processes.

FIG. 7 is a schematic sectional view showing a variable resistor element regarding the example 1 of the present invention. This variable resistor element comprises a second electrode 13 serving as a lower electrode, a variable resistor 12, and a first electrode 11 serving as an upper electrode laminated sequentially in a direction perpendicular to a substrate. In addition, in order to apply a voltage pulse to the first electrode 11 and the second electrode 13, a contact hole 15 is formed in an interlayer insulation film 14 and a metal wiring 16 is provided. The variable resistor element can be manufactured through the following processes.

Figure 2:
FIG. 2 is a schematic sectional view showing a variable resistor element according to an embodiment of the present invention in the order of manufacturing processes.

First, as shown in FIG. 2, the second electrode 13 serving as the lower electrode is deposited on a base substrate (not shown) by sputtering method. For example, the second electrode 13 is formed such that a titanium nitride (TiN) film (the second electrode 13 is referred to as the TiN film 13 in this embodiment hereinafter) that is a conductive material is deposited so as to be 200 nm in thickness.

Figure 3:
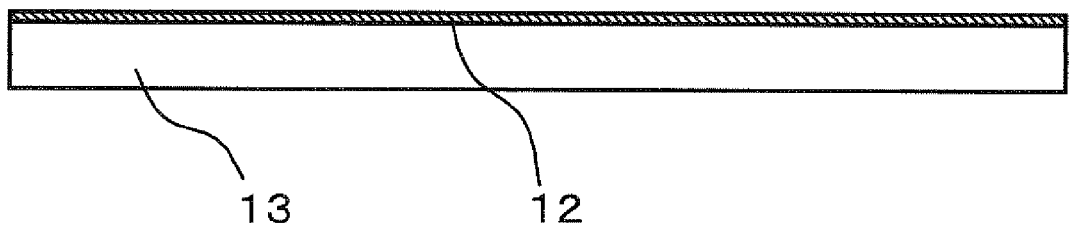
FIG. 3 is a schematic sectional view showing the variable resistor element according to the embodiment of the present invention in the order of manufacturing processes.

Next, as shown in FIG. 3, in order to form the variable resistor material film 12 comprising an oxynitride of the transition metal element on the surface of the TiN film 13, oxidation process is performed. According to this example, the oxidation process is performed at a normal pressure (1013 Pa) in $O_2$ atmosphere by a RTO (Rapid Thermal Oxidation) method at a substrate heating temperature of 500° C. for two minutes to form the titanium oxynitride layer (TiON) 12 having a thickness of 10 nm.

Figure 4:
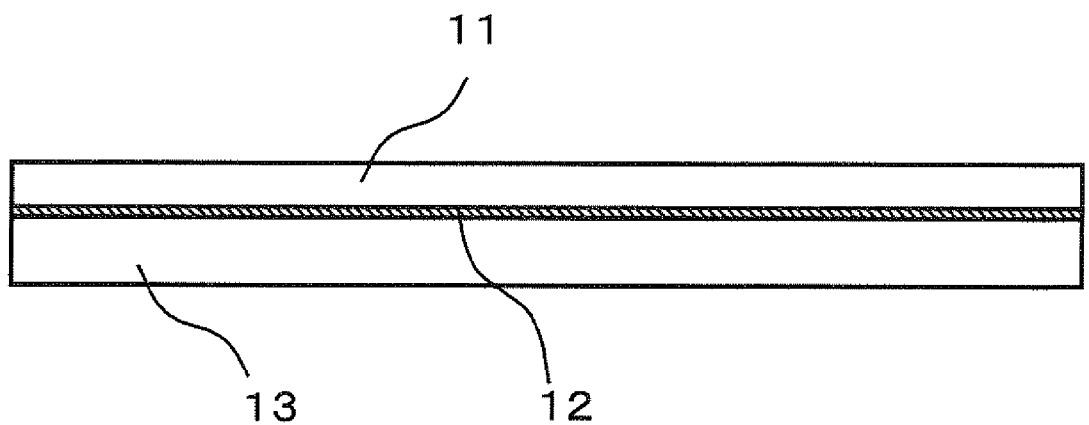
FIG. 4 is a schematic sectional view showing the variable resistor element according to the embodiment of the present invention in the order of manufacturing processes.

Then, as shown in FIG. 4, the TiN film 11 is deposited as one example of the first electrode serving as the upper electrode on the TiON layer 12 so as to be 100 nm in film thickness by sputtering method.

Figure 5:
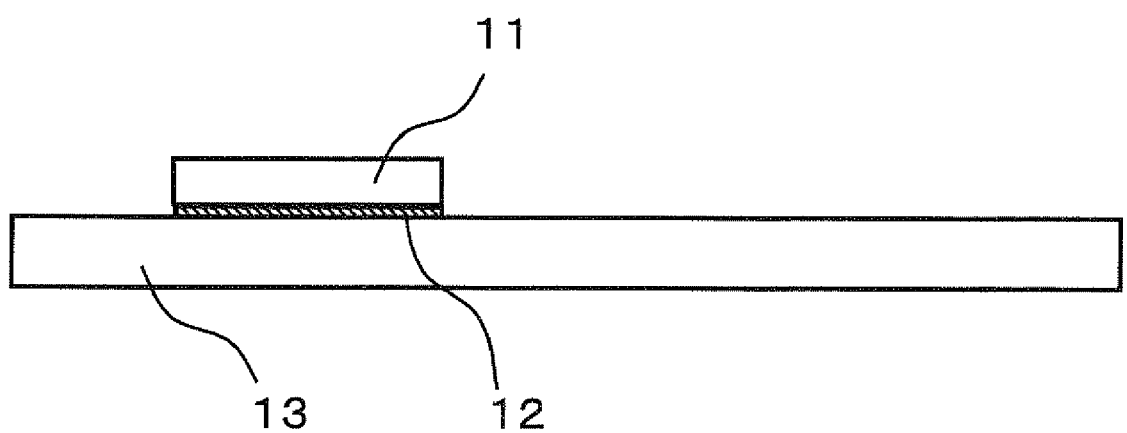
FIG. 5 is a schematic sectional view showing the variable resistor element according to the embodiment of the present invention in the order of manufacturing processes.

Then, as shown in FIG. 5, the TiN film 11 serving as the first electrode material and the TiON film 12 serving as the variable resistor material are sequentially dry-etched using a resist patterned by the well-known photolithography method as a mask. In addition, according to this example, in order to evaluate area dependency of the switching characteristics of the variable resistor element, four kinds of variable resistor elements in which the processing areas of the first electrodes 11 formed by the above patterning are 0.043 $\mu m^2$, 0.058 $\mu m^2$, 0.080 $\mu m^2$, and 1.04 $\mu m^2$ are manufactured.

Then, the TiN film 13 serving as the lower electrode is processed using a resist patterned by the well-known photolithography method as a mask (processing pattern is not shown).

Figure 6:
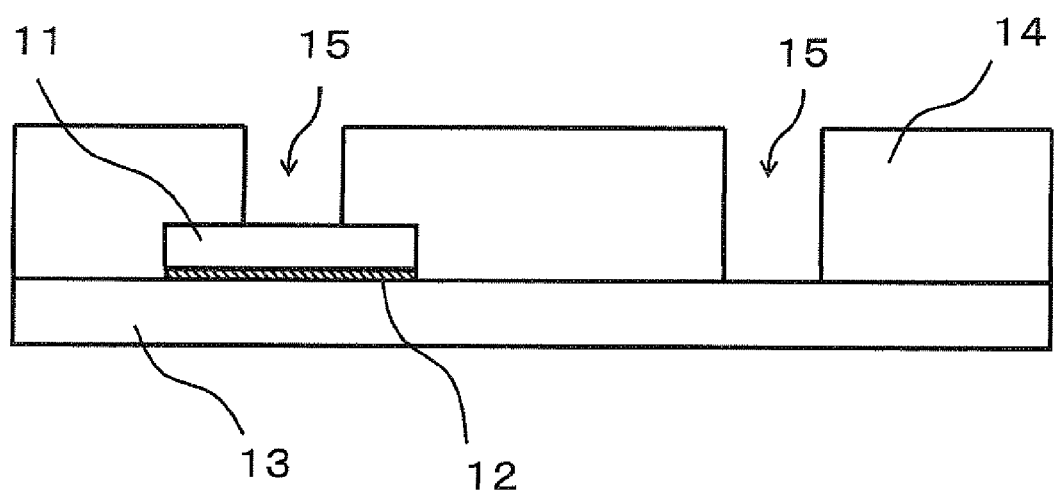
FIG. 6 is a schematic sectional view showing the variable resistor element according to the embodiment of the present invention in the order of manufacturing processes.

Next, as the interlayer insulation film 14, a silicon oxide film having a thickness of 500 nm is formed by an atmospheric pressure CVD method using TEOS (tetraethoxysilane) as a raw material mixed with ozone and oxygen. Thus, as shown in FIG. 6, the interlayer insulation film 14 is etched away using a resist patterned by the photolithography method as a mask, whereby the contact hole 15 reaching the first electrode 11 or the second electrode 13 is formed.

Next, as a material film of the metal wiring to apply the voltage pulse to the first electrode 11 and the second electrode 13, a TiN film having a thickness of 50 nm and a Al—Si—Cu film having a thickness of 400 nm and a TiN film having a thickness of 50 nm are sequentially deposited by the sputtering method (laminated structure of TiN/Al—Si—Cu/TiN). Then, the metal wiring material is etched away using a resist patterned by the photolithography as a mask, the metal wiring 16 connected to the first electrode 11 or the second electrode 13 through the contact hole 15 is formed as shown in FIG. 7.

In addition, description for general processes such as a process for applying, exposing and developing the photoresist, a process for removing the photoresist after etching, and a cleaning process after etching and removing the resist are omitted.

Then, a description will be made of a measuring device and measuring process to evaluate the variable resistor element manufactured as described above hereinafter.

Figure 8:
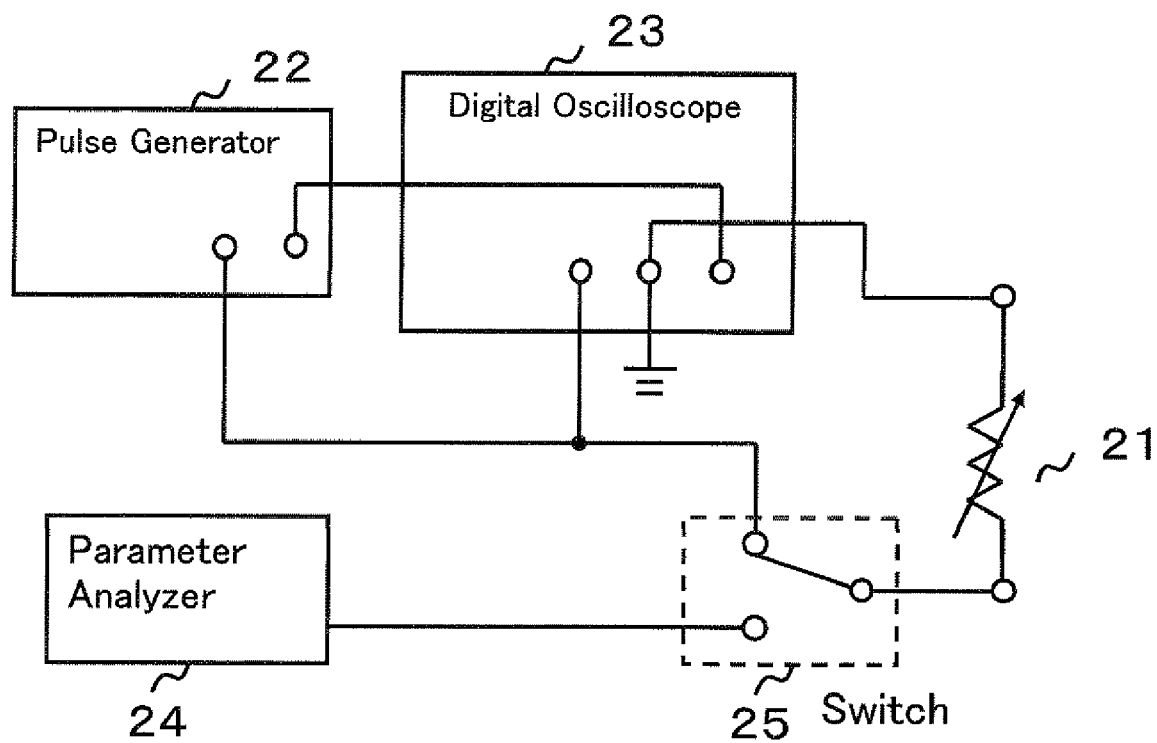
FIG. 8 is a view showing a constitution of a measuring system for voltage pulse application to the variable resistor element and for measuring I-V characteristics.

FIG. 8 shows a constitution of a measuring system for voltage pulse application to the variable resistor element and for measuring I-V characteristics. The measuring system comprises a variable resistor element 21, a pulse generator 22, a digital oscilloscope 23, a parameter analyzer 24, and a switch 25. The parameter analyzer 24 uses model number 4156B produced by Agilent Technologies, for example, as a current/voltage measurement device.

One end of the variable resistor element 21 is connected to the ground of the digital oscilloscope 23, and the other end is connected to a fixed end of the switch 25. Furthermore, one end of the digital oscilloscope 23 and one end of the pulse generator 22 are connected. Thus, one movable end of the switch 25 is connected to the other end of the digital oscilloscope 23 and the other end of the pulse generator 22, whereby one circuit is formed. The other movable end of the switch 25 is connected to the parameter analyzer 24, whereby the other circuit is formed. Thus, both circuits can be switched by the switching operation of the movable ends of the switch 25 to provide the measuring system.

Thus, when the voltage pulse is applied, the pulse generator 22 and the variable resistor element 21 are electrically connected by the operation of the switch 25 and the voltage pulse is applied. The voltage pulse generated at this time is observed by the digital oscilloscope 23. Then, the switch 25 is connected to the parameter analyzer 24 (cut from the pulse generator 22) and I-V characteristics of the variable resistor element 21 are measured.

The voltage pulse is generated from the pulse generator 22 so that a voltage of −2 V (negative pulse having a voltage amplitude of 2 V) having a pulse width (pulse applying time) of 100 nsec is applied to the upper electrode of the variable resistor element 21 and a resistance value after the application as the I-V characteristics is measured by the parameter analyzer 24. Then, the voltage pulse is generated from the pulse generator 22 so that a voltage of +2 V (positive pulse having a voltage amplitude of 2 V) having a pulse width of 30 nsec is applied to the variable resistor element 21 again and a resistance value after the application as the I-V characteristics is measured by the parameter analyzer 24.

The measurement of the I-V characteristics is performed every application of the voltage pulse and the current value at the time of the application of the voltage of +0.7 V is measured. Based on the result, the resistance value of the variable resistor element after the voltage pulse application is found. According to the variable resistor element used in this embodiment, as the resistance value is changed by applying a voltage pulse of ±2 V, since the resistance value is hardly changed when a relatively low voltage of ±0.7 V is applied, the resistance value of the variable resistor element after the voltage pulse application can be measured without affecting the following voltage pulse application.

Figure 9:
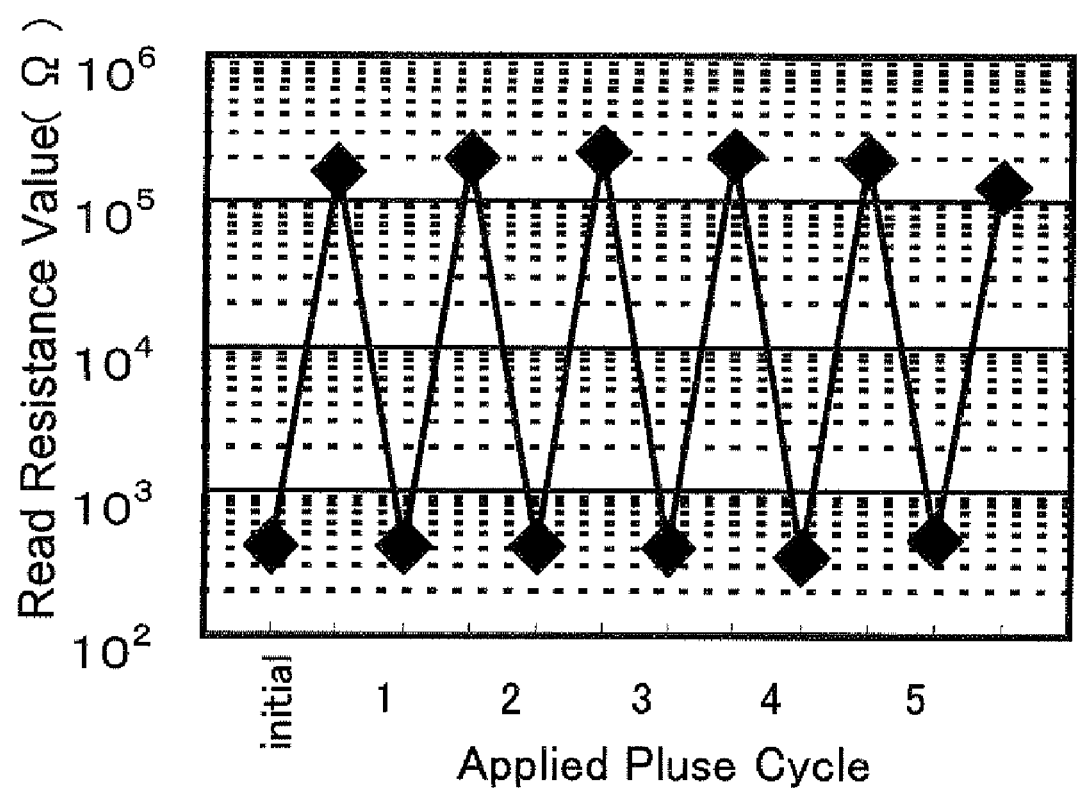
FIG. 9 is a graph showing voltage pulse application and a resistance change of the variable resistor element according to the embodiment of the present invention.

FIG. 9 is a view showing a change of the resistance value when a negative voltage (−2 V) having a pulse width of 100 nsec and a positive. voltage (+2 V) having a pulse width of 30 nsec are alternately applied to the variable resistor element having an upper electrode area of 0.043 $\mu m^2$. The horizontal axis designates the number of applied pulse cycles and the vertical axis designates a read resistance value in logarithmic scale. The applied pulse cycle number is counted as one time after applying the negative voltage pulse and the positive voltage pulse alternately once. As shown in FIG. 9, the resistance value can be changed to the high resistance state (about $2 \times 10^5$ Ω) by applying the negative (−2 V) voltage pulse and then the resistance value can be changed to the low resistance state (about $4 \times 10^2$ Ω) by applying the positive (+2 V) voltage pulse. Then, it can be changed to the high resistance state by applying the negative voltage pulse and then changed to the low resistance state by applying the positive voltage pulse. As described above, it has been confirmed that the variable resistor element having the TiON film as the variable resistor performs the switching operation at a resistance ratio (ratio between the resistance value of the high resistance state and the resistance value of the low resistance state) of about 500 times. In addition, the resistance state is maintained until the next voltage pulse is applied although it is not shown. This shows that the variable resistor element can perform the switching operation reversibly between binary data (high resistance state and low resistance state) as a nonvolatile memory element.

In addition, a current flowing in the element (programming current) when the resistance state is changed by applying the voltage pulse is as small as several hundred μA.

Figure 10:
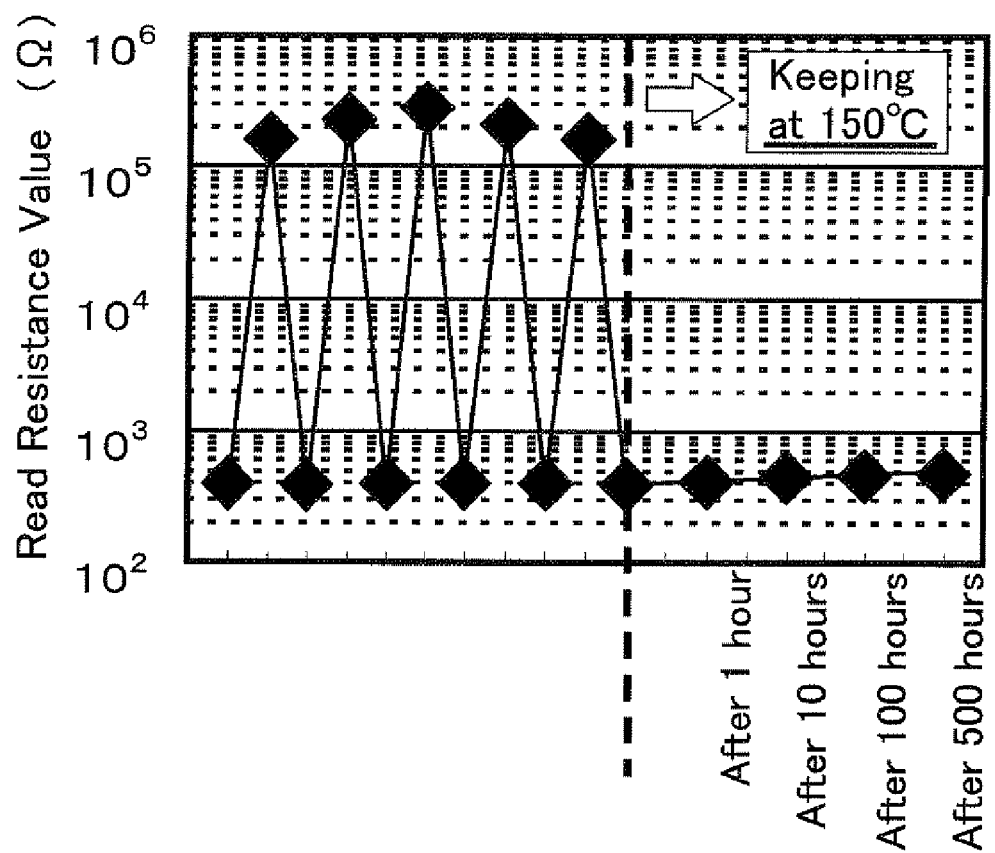
FIG. 10 is a graph showing retaining characteristics of the variable resistor element in a low resistance state according to the embodiment of the present invention.

After the switching operation, the variable resistor element in which data is programmed in the low resistance state (the resistance value is changed to the low resistance state) is held at a high temperature (150° C.) and the resistance is read at room temperature after one hour, 10 hours, 100 hours and 500 hours. The result is shown in FIG. 10. Even after the variable resistor element is held at high temperature for 500 hours, the resistance value is not deteriorated (the resistance value is not increased in the case of the low resistance state), and shows preferable retaining characteristics.

Figure 11:
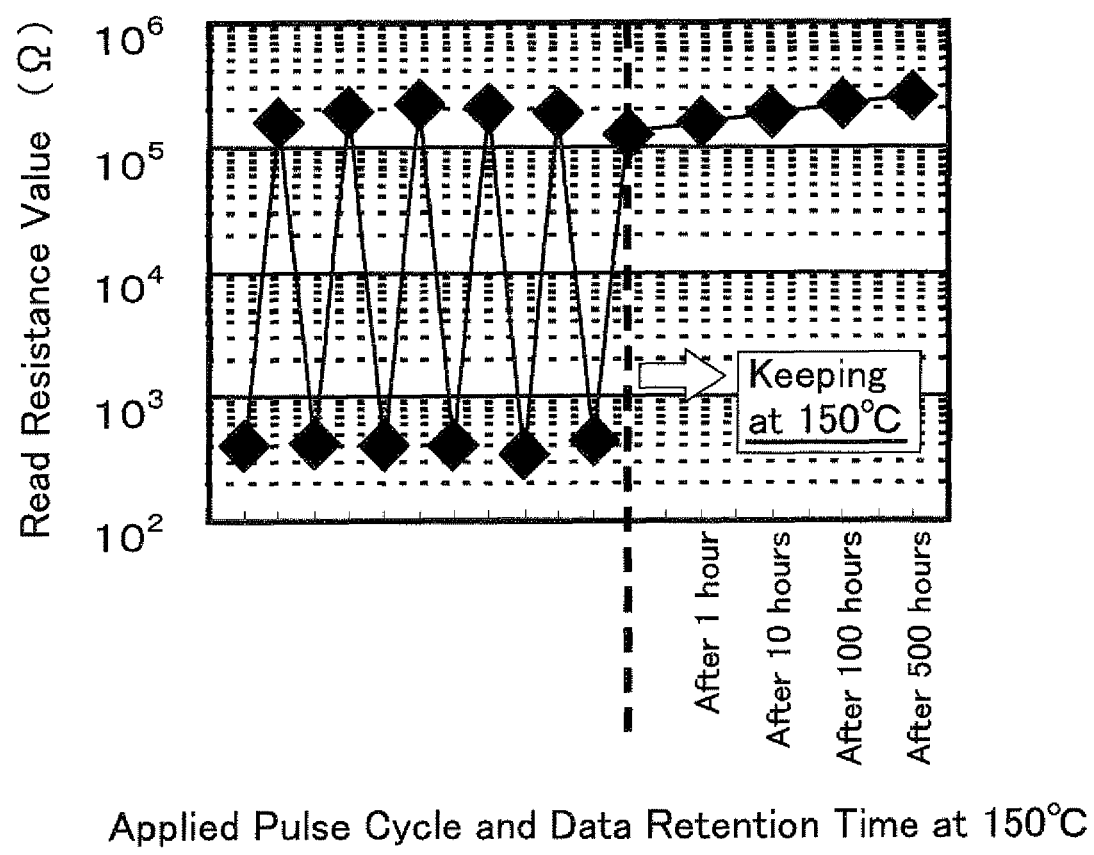
FIG. 11 is a graph showing retaining characteristics of the variable resistor element in a high resistance state according to the embodiment of the present invention.

Similarly, the variable resistor element in which data is programmed in the high resistance state (the resistance value is changed to the high resistance state) is held at a high temperature (150° C.) and the resistance is read at room temperature after one hour, 10 hours, 100 hours and 500 hours. The result is shown in FIG. 11. Even after the variable resistor element is held at high temperature for 500 hours, the resistance value is not deteriorated (the resistance value is not decreased in the case of the high resistance state), and shows preferable retaining characteristics.

According to the characteristics described above, it means that the variable resistor element according to this embodiment can be applied to a nonvolatile memory device capable of writing data repeatedly by voltage pulse application and having preferable data retaining characteristics under a high-temperature atmosphere.

Figure 12:
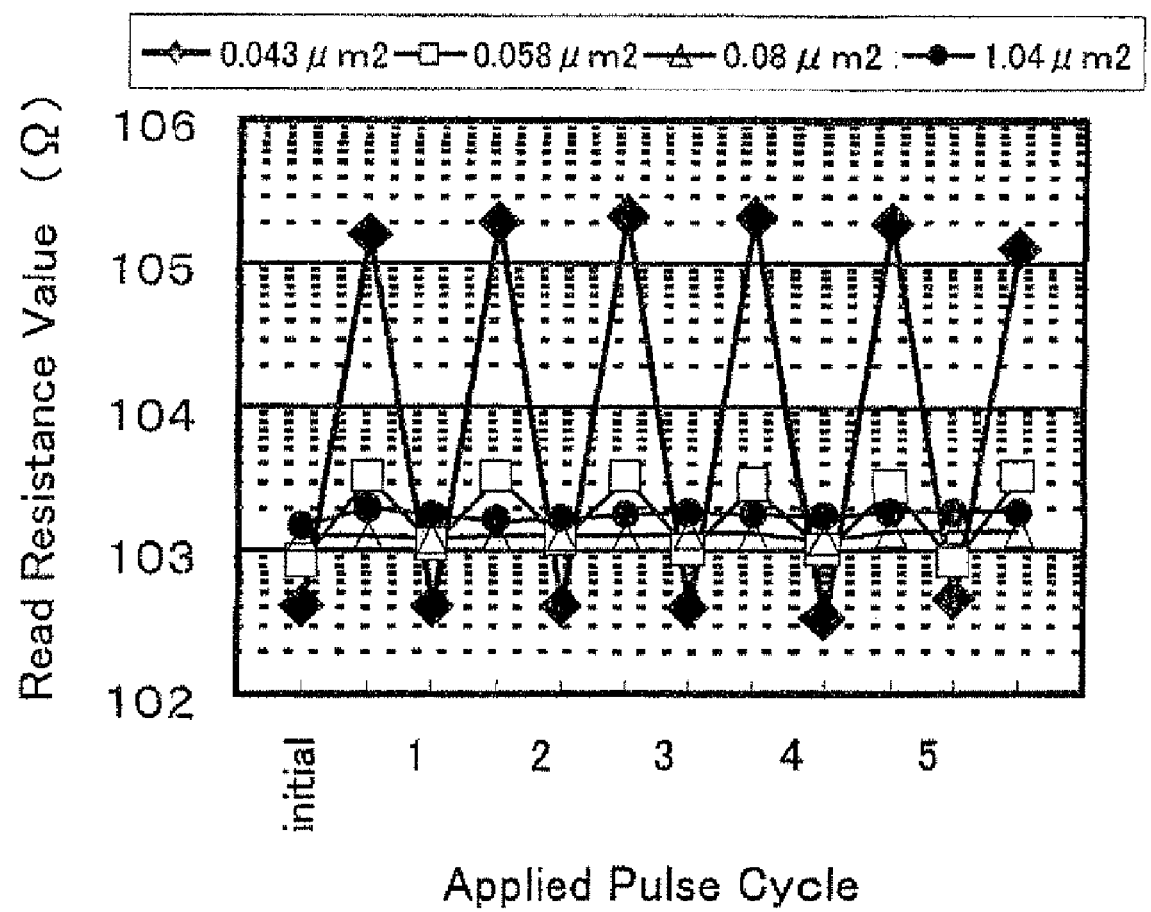
FIG. 12 is graph showing voltage pulse application and a resistance change of the variable resistor element according to the embodiment of the present invention using a first electrode area as a parameter.

Next, a description will be made of area dependency of the variable resistor element according to an aspect of the present invention having the variable resistor formed of the oxynitride of the transition metal element. FIG. 12 shows switching characteristics of the four kinds of variable resistor elements in which the processing areas of the upper electrodes are 0.043 $\mu m^2$, 0.058 $\mu m^2$, 0.080 $\mu m^2$, and 1.04 $\mu m^2$. While it has been confirmed that large switching having a resistance ratio of 500 times can be repeated in the case of the smallest area of 0.043 $\mu m^2$, a switching operation has only a resistance ratio of 3 times in the case of 0.058 $\mu m^2$ even under the same voltage pulse application condition. In addition, the switching phenomenon cannot be seen in larger areas (0.080 $\mu m^2$ and 1.04 $\mu m^2$).

Figure 13:
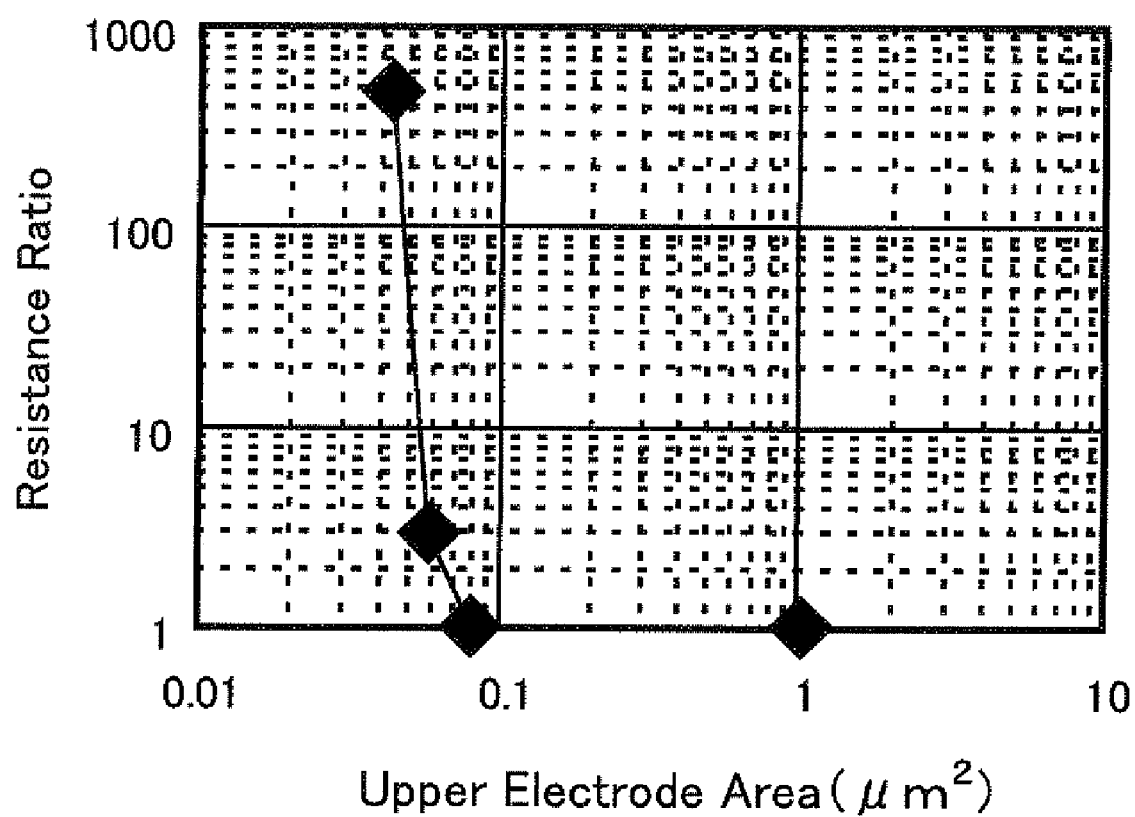
FIG. 13 is a graph showing a relation between the first electrode area and a resistance ratio of switching.

FIG. 13 shows a relation between the area of the upper electrode and resistance ratio based on the result in FIG. 12. It has been found that although the switching operation does not occur when the electrode area is large, the switching phenomenon is seen when the electrode area is in a specific range below 0.06 $\mu m^2$ approximately. In addition, although the area of the first electrode serving as the upper electrode is set to the electrode area in this example, when the area in which the second electrode serving as the lower electrode and the variable resistor are in contact with each other is smaller than the area in which the first electrode and the variable resistor are in contact with each other, since the smaller area contributes to the electric characteristics of the variable resistor dominantly, the smaller area (area of the second electrode) may be regarded as the electrode area.

In addition, although the lower electrode 13 serving as the second electrode is a single film of TiN (titanium nitride) in the above example 1, the lower electrode is not limited to this. For example, it may be a laminated film such as a TiN/Pt or TiN/Al—Cu/TiN in which the surface is formed of TiN film. When the variable resistor has such constitution, since the film can be formed in an oxidation process at a temperature lower than the melting point of Al, Al material having low resistivity can be used.

In addition, although the lower electrode 13 serving as the second electrode comprises the TiN (titanium nitride) and the variable resistor comprises the TiON (titanium oxynitride) as the oxynitride of the transition metal element in the above example 1, the present invention is not limited to the above. For example, the lower electrode material may comprise a film formed of a conductive nitride such as titanium nitride, nickel nitride, vanadium nitride, zirconium nitride, tungsten nitride, cobalt nitride, and zinc nitride. In this case, the variable resistor 12 formed of the oxynitride of the transition metal element is formed of titanium oxynitride, nickel oxynitride, vanadium oxynitride, zirconium oxynitride, tungsten oxynitride, cobalt oxynitride, and zinc oxynitride, respectively.

In addition, although the upper electrode 11 serving as the first electrode comprises the TiN film in the above example 1, it may be formed of noble metal such as Pt or single metal selected from Ag, Al, Cu, Ni, and Ti or their alloy.

In addition, as another method of forming the variable resistor material film 12, the lower electrode 13 may be formed of a conductive oxide and by performing nitriding treatment on its surface, the variable resistor material film 12 may be formed of the oxynitride of the transition metal element. In this case, as the conductive oxide, a material causing the variable resistor material film 12 formed of its nitride to show the switching operation is to be selected.

EXAMPLE 2

A variable resistor element according to a second embodiment of the present invention has the same constitution as that of the variable resistor element of the first embodiment shown FIGS. 2 to 7. However, a manufacturing method of a variable resistor 12 is different from that of the variable resistor element in the first embodiment. That is, while the variable resistor material film 12 comprising the oxynitride of the transition metal element is formed by performing the oxidation treatment on the surface of the conductive nitride 13 of the lower electrode in the first embodiment, the variable resistor material film 12 is formed by CVD method in the second embodiment of the present invention. This will be described as an example 2 in detail hereinafter.

The variable resistor element in the example 2 can be manufactured by the following processes.

First, as shown in FIG. 2 similar to the example 1, a Pt film 13 having a film thickness of 200 nm is deposited on a base substrate (not shown) by the sputtering method as one example of the second electrode serving as the lower electrode.

Then, as shown in FIG. 3, a TiON film 12 is formed by a well-known technique. According to this example, a film having a film thickness of 10 nm is formed using $TiCl_4$ and $N_2O$ as source gas at a processing temperature of 400° C. by bias ECR-CVD (Electron Cyclotron Resonance Chemical Vapor Deposition) method.

The variable resistor element according to the second embodiment of the present invention can be manufactured through the same processes as those in the example 1 shown in FIGS. 4 to 7.

In addition, although the variable resistor 12 comprising the oxynitride of the transition metal element is formed by CVD method in the example 2, it is not limited to this and it may be formed by the sputtering method. The method may be reactive sputtering in $N_2$—$O_2$ mixed gas using Ti as a target, or may be sputtering in Ar gas using TiON as a sinter target.

In addition, although the variable resistor 12 comprises the TiON (titanium oxynitride) film as the oxynitride of the transition metal element in the example 2, it is not limited to this, and may be nickel oxynitride, calcium oxynitride, vanadium oxynitride, iridium oxynitride, or ruthenium oxynitride.

In addition, although the lower electrode 13 serving as the second electrode comprises the Pt film in the above example 2, it may comprise the TiN film similar to the example 1 or Al film, or may be noble metal except for Pt, single metal selected from Ag, Al, Cu, Ni, or Ti, or their alloy.

EXAMPLE 3

According to a third embodiment of the present invention, a description will be made of a memory device comprising the variable resistor element formed of the oxynitride of the transition metal element described above in detail. The third embodiment will be described as an example 3.

Figure 14:
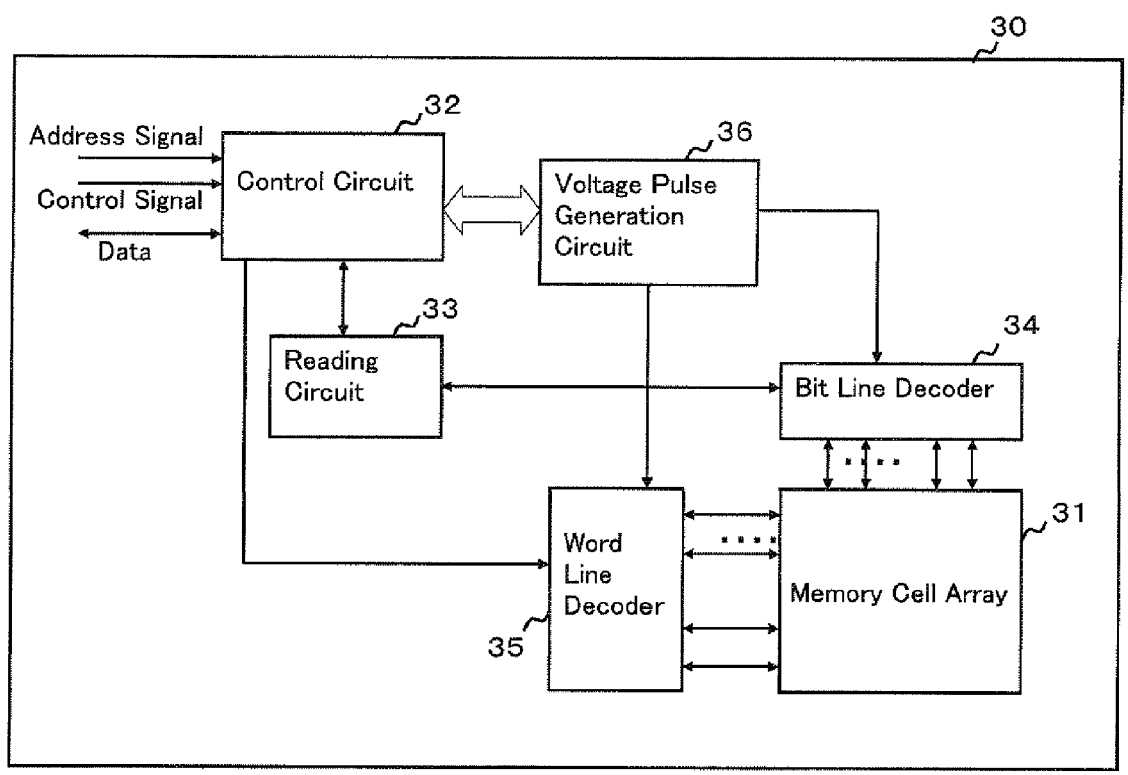
FIG. 14 is a block diagram showing a schematic block constitution according to one embodiment of a memory device in the present invention.

FIG. 14 is a schematic block diagram showing one embodiment of a memory device 30 according to the present invention. The memory device 30 comprises a control circuit 32, a reading circuit 33, a bit line decoder 34, a word line decoder 35, and a voltage pulse generation circuit 36 as peripheral circuits of a memory cell array 31.

The control circuit 32 controls programming, erasing and reading of the memory cell array 31. Data is stored in a specific memory cell corresponding to an address signal in the memory cell array 31, and the data is outputted to an external device through the reading circuit 33. The control circuit 32 controls the bit line decoder 34, the word line decoder 35 and the voltage pulse generation circuit 36 based on the address signal, data input at the time of programming and a control input signal to control the reading, programming and erasing actions of the memory cell array 31. According to an example shown in FIG. 14, the control circuit 32 functions as a general address buffer circuit, data input/output buffer circuit, and control input buffer circuit although they are not shown.

The word line decoder 35 is connected to each word line of the memory cell array 31 to select the word line corresponding to the address signal in the memory cell array 31, and the bit line decoder 34 is connected to each bit line of the memory cell array 31 to select the bit line corresponding to the address signal in the memory cell array 31.

The voltage pulse generation circuit 36 generates each voltage to the bit line and the word line to perform the reading action, the programming action and the erasing action of the memory cell array 31. At the time of programming action, each voltage of the bit line and the word line is set so that a voltage pulse higher than a threshold voltage may be applied only between the upper electrode and the lower electrode of the variable resistor element of the memory cell selected by the address signal, and each voltage is applied from the voltage pulse generation circuit 36 to the selected and unselected bit lines and selected and unselected word lines through the bit line decoder 34 and the word line decoder 35. An applying time of the programming voltage pulse is controlled by a pulse width set by the control circuit 32, and the programming voltage pulse is applied to the variable resistor element of the selected memory cell to be programmed.

Figure 15:
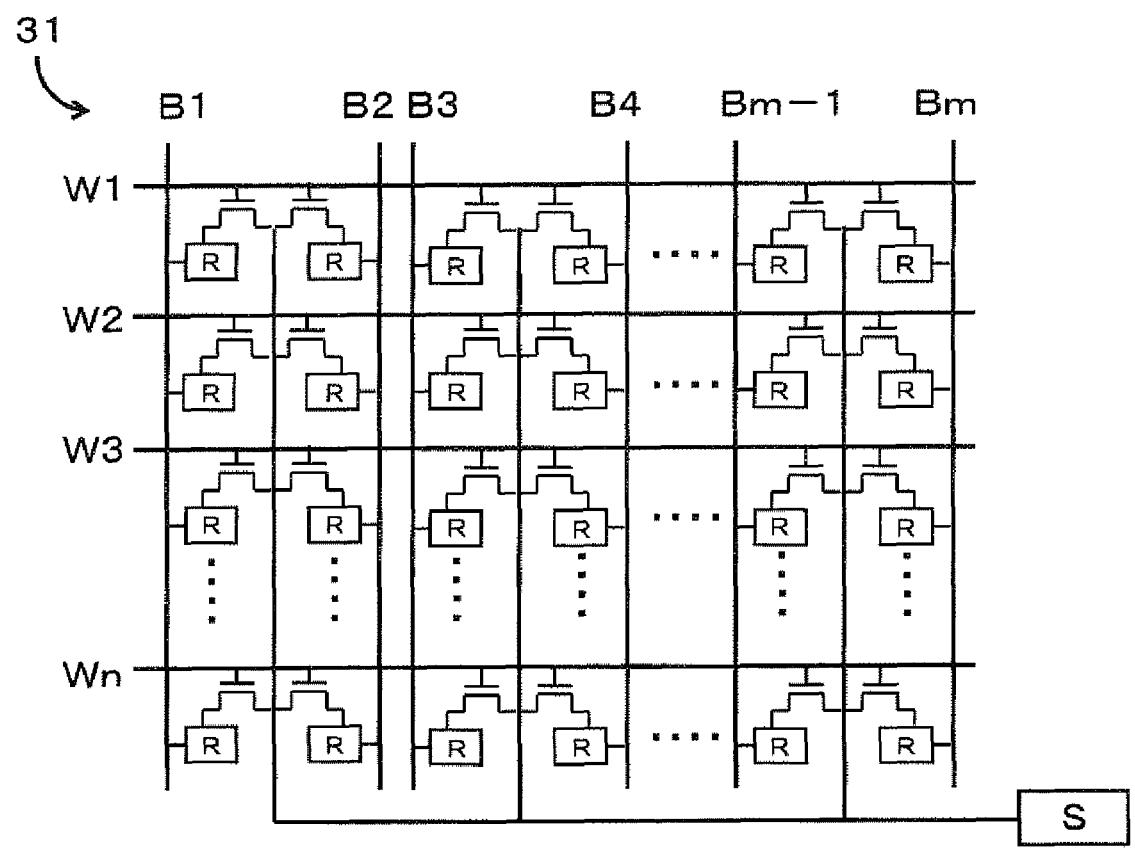
FIG. 15 is a view showing a schematic memory cell array constitution according to one embodiment of the memory device in the present invention.

A memory cell constitution shown in FIG. 15 can be applied to one example of the memory cell array 31. According to the memory cell array 31, one memory cell comprises one selection transistor and one variable resistor element R, that is, 1T-1R constitution. In FIG. 15, the gate of the selection transistor of each memory cell is connected to the word line (W1 to Wn), and the source of the selection transistor of each memory cell is connected to the source line S. In addition, one end (upper electrode side) of the variable resistor element R in each memory cell is connected to the bit line (B1 to Bm).

Next, the operation of the memory device shown in FIGS. 14 and 15 will be described hereinafter.

First, the programming action of the memory cell will be described. Here, it is assumed that the cell is in the program state when the variable resistor element R is in the low resistance state. The word line Wx connected to the selected cell is set at +2 V according to the address signal of the word line decoder 35, and the word line Wy connected to the unselected cell is set at 0 V according to the address signal of the word line decoder 35. Thus, the source line is set at 0 V, and the bit line Bx connected to the selected cell is set at +2 V according to the address signal of the bit line decoder 34, and the bit line By connected to the unselected cell is set at 0V according to the address signal of the bit line decoder 34. Thus, since the positive voltage is applied to the upper electrode of the variable resistor element R of the selected cell, data is programmed in the low resistance state. Meanwhile, since the voltage is not applied to the variable resistor of the variable resistor element R of the unselected cell, data programming is not performed (data is not changed). Here, the voltage applied to the word line Wx needs to be not less than a voltage at which the selection transistor is turned on (threshold voltage of the transistor), and the voltage applied to the bit line Bx needs to be not less than a voltage at which the variable resistor element is switched (threshold voltage of the switching operation) when the source line is at the ground voltage.

Next, the reading action of the memory cell will be described. The word line Wx connected to the selected cell is set at +2 V according to the address signal of the word line decoder 35, and the word line Wy connected to the unselected cell is set at 0 V according to the address signal of the word line decoder 35. Then, the source line is set at 0 V and the bit line By connected to the unselected cell is set at 0 V according to the address signal of the bit line decoder 34, and the bit line Bx connected to the selected cell is set at the reading voltage of +1 V according to the address signal of the bit line decoder 34. Here, the reading voltage has to be not more than the voltage at which the variable resistor element R is switched (threshold voltage of the switching) to prevent the variable resistor element R of the unselected cell from being switched to write data. According to this example, similar to the example 1, the reading voltage is set at +0.7 V. At the time of reading action, the current flowing in the selected memory cell is converted to the voltage by the bit line decoder 34 and the reading circuit 33 determines the voltage value and the determined result is transferred to the control circuit 32 and outputted to the outside. When the resistance state of the variable resistor element of the selected memory cell is high, the memory cell current is small and when the resistance state is low, the memory cell current is large, so that data is read by converting the current difference to the voltage.

Next, the erasing action of the memory cell will be described. Here, it is assumed that the cell is in the erase state when the variable resistor element R. is at high resistance state. The word line Wx connected to the selected cell is set at +2 V according to the address signal of the word line decoder 35, and the word line Wy connected to the unselected cell is set at 0V according to the address signal of the word line decoder 35. Then, the source line is set at +2 V and the bit line Bx connected to the selected cell is set at 0 V according to the address signal of the bit line decoder 34, and the bit line By connected to the unselected cell is set at +2V according to the address signal of the bit line decoder 34. Thus, since the negative voltage is applied to the upper electrode of the variable resistor element R of the selected cell, data is erased in the high resistance state (data is written in the high resistance state). Meanwhile, since the voltage is not applied to the variable resistor of the variable resistor element R of the unselected cell, the data programming is not performed (data is not changed). Here, the voltage applied to the word line Wx has to be not less than the voltage at which the selection transistor is turned on (threshold voltage of the transistor) and the voltage applied to the source line has to be not less than the voltage at which the variable resistor element is switched (threshold voltage of switching).

Figure 16:
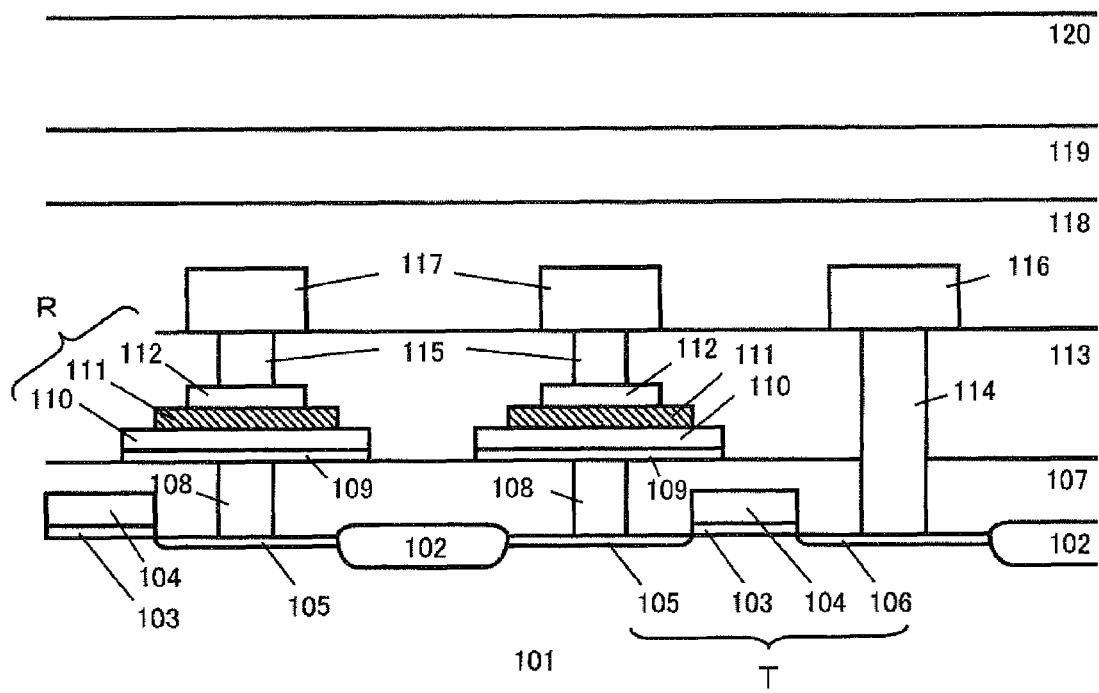
FIG. 16 is a view showing a schematic memory cell sectional structure according to one embodiment of the memory device in the present invention.

A memory cell comprising 1T-1R constitution as shown by a schematic sectional view in FIG. 16 may be applied to one example of the memory cell of the memory device according to the present invention described above. The memory device according to the present invention having the memory cell can be manufactured by the following manufacturing processes.

First, a selection transistor T is formed on a semiconductor substrate 101. That is, the selection transistor T comprising a gate insulation film 103, a gate electrode 104, a drain diffusion layer region 105 and a source diffusion layer region 106 is formed on the semiconductor substrate 101 comprising an element isolation region 102. At this time, a transistor comprising the peripheral circuits (the control circuit 32, the reading circuit 33, the bit line decoder 34, the word line decoder 35, the voltage pulse generation circuit 36 and the like) other than the memory cell is formed together although it is not shown.

Next, a first interlayer insulation film 107 comprising BPSG (Boron Phosphorous Silicate Glass) is formed and a contact hole 108 reaching the drain region 105 of the selection transistor T is formed by the well-known lithography method and dry etching method. Then, a contact plug is formed by embedding only the contact hole 108 with conductive polysilicon by a well-known method.

Then, a TiN/Ti film is formed so as to be 20 nm/50 nm in thickness by sputtering method as a barrier metal layer 109 to ensure the electric connection between the conductive contact plug embedded in the contact hole 108 and the lower electrode 110. A TiN/Pt film as a second electrode 110 is formed so as to be 100 nm/100 nm in thickness on the TiN/Ti barrier metal layer 109 and then thermal oxidation treatment is performed at normal pressure (1013 Pa) in $O_2$ atmosphere by the RTO (Rapid Thermal Oxidation) method at a substrate heating temperature of 500° C. for 2 minutes, whereby a titanium oxynitride (TiON) layer 111 having a thickness of 10 nm is formed on the surface of the second electrode 110. Then, a Pt film having a thickness of 100 nm is formed as a first electrode 112 serving as the upper electrode.

Then, the first electrode 112, the variable resistor film 111, and the second electrode 110 are sequentially processed by the well-known lithography method and the dry etching method, whereby the variable resistor element R is completed. A second interlayer insulation film 113 having a thickness of 50 to 60 nm is formed on the variable resistor element R and a contact hole 115 connected to the variable resistor element R and a contact hole 114 connected to the source diffusion layer region of the selection transistor are formed. Then, first wirings 116 and 117 are formed of TiN/Al—Si/TiN/Ti as a first wiring material processed by the well-known lithography method and dry etching method.

Then, a third interlayer insulation film 118 is formed and a contact hole (not shown) reaching the first wiring is formed and then a second wiring 119 is formed of TiN/Al—Si/TiN/Ti as a second wiring material processed by the well-known lithography method and dry etching method (processing pattern is not shown). Finally, a SiN film is formed as a surface protection film 120 by plasma CVD method, whereby the memory device having the variable resistor element R and the selection transistor T in the memory cell is completed.

In addition, although the processes for forming the contact hole and for the first and second wirings of the peripheral circuits are omitted in the above manufacturing processes, they may be formed together when the memory cell is formed.

In addition, although the variable resistor 111 is formed in the above example 3 by the same method as in the example 1, it may be formed by the CVD method or sputtering method described in the example 2.

Although the driving method of the variable resistor element and the memory device using the variable resistor element as the memory cell have been described using specific numeric values in the above, it has been confirmed already when the variable resistor element is formed of a different material and has different composition and structure, the numeric values are also different, so that the manufacturing method according to the present invention and the device according to the present invention are not limited to the above illustrated numeric values.

In addition, although the functional, constitution and the sectional structure of the device according to the present invention have been specifically described above, they can be appropriately changed within the scope of the present invention.

For example, although the memory cell has the 1T-1R constitution comprising one variable resistor element R and one selection transistor in the above example 3, the present invention is not limited to this. For example, a memory cell constitution in which each of the bit line and word line is directly connected to the first electrode or the second electrode and data of the variable resistor positioned at a cross point between both electrodes is directly read, that is, a cross-point constitution may be employed in the memory cell. In this case, data may be read through the word line decoder 35 although data is read through the bit line decoder 34 in FIG. 14. In addition, a 1D-1R constitution in which the variable resistor element R and a diode are connected in series to reduce a parasitic current in the cross-point constitution may be employed in the memory cell. Although the diode is connected to the variable resistor in series outside the first electrode or the second electrode in general, it may be positioned between the variable resistor and the first electrode or between the variable resistor and the second electrode. As the diode, a material showing PN diode characteristics or schottky diode characteristics, or varistor of ZnO or $Bi_2O_3$ is used.

In addition, although the voltage pulse generation circuit shown in FIG. 14 generates the voltage pulse for each action of programming, erasing and reading from one circuit block, a voltage pulse generation circuit may be provided with respect to each action. Furthermore, the voltage pulse generation circuit generating the voltage pulse for the reading action may be provided in the bit line decoder 34 and the word line decoder 35.

In addition, although the variable resistor of the variable resistor element according to the present invention is sandwiched between the first electrode and the second electrode, it may be disconnected from the first electrode and the second electrode as the above constitution in which a diode is positioned between the variable resistor and the first electrode or the second electrode. In addition, in this case, since the variable resistor is not in contact with the first electrode or the second electrode, in the relation between the electrode area and the resistance ratio described in the example 1 with reference to FIG. 13, a region in which the first electrode or the second electrode faces the variable resistor is set to the electrode area.

In addition, although titanium oxynitride is described as TiON and titanium nitride is described as TiN in the above examples 1 to 3, they are abbreviations and their relative proportions are not limited.

The invention claimed is:

1. A variable resistor element, comprising:
 a first electrode;
 a second electrode; and
 a variable resistor positioned between the first electrode and the second electrode,
 wherein an electric resistance between the first electrode and the second electrode changes when a voltage pulse is applied between the first electrode and the second electrode,
 wherein the variable resistor element does not include a chalcogenide compound, and
 wherein the variable resistor is an oxynitride of a transition metal element.

2. The variable resistor element according to claim 1, wherein the variable resistor is an oxynitride of an element selected from titanium, nickel, vanadium, zirconium, tungsten, cobalt, and zinc.

3. The variable resistor element according to claim 1, wherein the second electrode is a conductive nitride containing the same element as the transition metal constituting the variable resistor which is an oxynitride.

4. The variable resistor element according to claim 3, wherein the second electrode is a conductive nitride of an element selected from titanium, nickel, vanadium, zirconium, tungsten, cobalt, and zinc.

5. The variable resistor element according to claim 1, wherein the smaller one of an area of a region in which the first electrode and the variable resistor contact or face each other and an area of a region in which the second electrode and the variable resistor contact or face each other is not more than 0.06 $\mu m^2$.

6. A manufacturing method of a variable resistor element, the variable resistor element comprises a first electrode, a second electrode, and a variable resistor positioned between the first electrode and the second electrode, wherein an electric resistance between the first electrode and the second electrode changes when a voltage pulse is applied between the first electrode and the second electrode, the method comprising:
 forming a first conductive material film of a nitride of a transition metal element;
 forming the second electrode of the first conductive material film and the variable resistor of an oxide of the first conductive material film by oxidizing a surface of the first conductive material film; and
 forming the first electrode by forming a second conductive material film,
 wherein the variable resistor element does not include a chalcogenide compound.

7. The manufacturing method of the variable resistor element according to claim 6, wherein the first conductive material film is a conductive nitride of an element selected from titanium, nickel, vanadium, zirconium, tungsten, cobalt, and zinc.

8. A memory device with a variable resistor element, the variable resistor element comprising:
 a first electrode;
 a second electrode; and a variable resistor positioned between the first electrode and the second electrode, wherein an electric resistance between the first electrode and the second electrode changes when a voltage pulse is applied between the first electrode and the second electrode, wherein the variable resistor element does not include a chalcogenide compound, and wherein the variable resistor is an oxynitride of a transition metal element.

9. The variable resistor element according to claim 1, wherein the variable resistor is in direct contact with the first electrode and with the second electrode.

10. The variable resistor element according to claim 1, wherein the variable resistor is arranged such that polarities of voltage pulses to change the electric resistance of the variable resistor from low to high resistance and from high to low resistance are opposite to each other.

11. The variable resistor element according to claim 10, wherein the variable resistor is arranged such that magnitudes of voltage pulses to change the electric resistance of the variable resistor from low to high resistance and from high to low resistance are substantially the same.

12. The manufacturing method of the variable resistor element according to claim 6, wherein the variable resistor is arranged to be in direct contact with the first electrode and with the second electrode.

13. The manufacturing method of the variable resistor element according to claim 6, wherein the variable resistor is arranged such that polarities of voltage pulses to change the electric resistance of the variable resistor from low to high resistance and from high to low resistance are opposite to each other.

14. The manufacturing method of the variable resistor element according to claim 13, wherein the variable resistor is arranged such that magnitudes of voltage pulses to change the electric resistance of the variable resistor from low to high resistance and from high to low resistance are substantially the same.

* * * * *